United States Patent [19]
Lee et al.

[11] Patent Number: 5,351,049
[45] Date of Patent: Sep. 27, 1994

[54] SUPERCONDUCTING QUANTIZER AND A/D CONVERTER SYSTEM

[75] Inventors: Gregory S. Lee; Herbert L. Ko, both of Mountain View, Calif.

[73] Assignee: Hewlett-Packard Company, Palo Alto, Calif.

[21] Appl. No.: 936,196

[22] Filed: Aug. 26, 1992

[51] Int. Cl.$^5$ .............................................. H03M 1/12
[52] U.S. Cl. ................................... 341/133; 341/155
[58] Field of Search ................ 341/133, 155; 505/827; 307/306

[56] References Cited

U.S. PATENT DOCUMENTS 4,386,361 5/1983 Lee ........................................ 257/36

Primary Examiner—Brian K. Young

[57] ABSTRACT

A periodic superconducting device signal quantizer for the fine resolution of the magnetic flux quantum $\Phi_0 = 2*10^{-15}$ Wb realized by a phase wheel 20 or a phase tree 100. The signal quantizer is used in conjunction with a superconducting A/D converter for achieving the 8–11 bit A/D converters with gigahertz, multi-gigahertz bandwidth. A method for an extra-bit resolution of the analog signal using the signal quantizer is described.

16 Claims, 9 Drawing Sheets

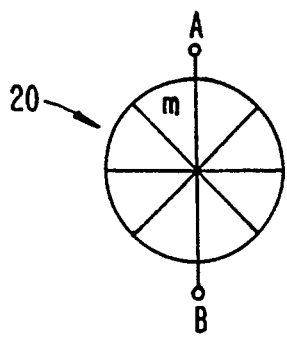
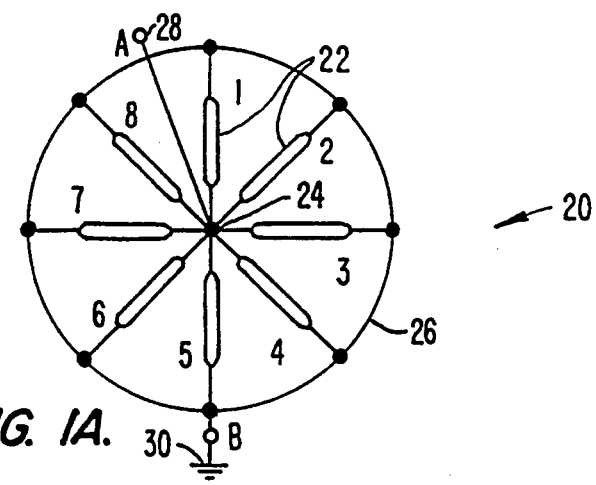
FIG. 1B.    FIG. 1A.
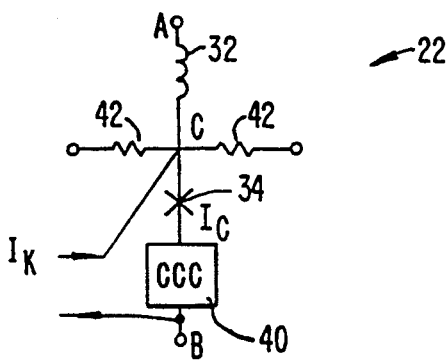
FIG. 2.
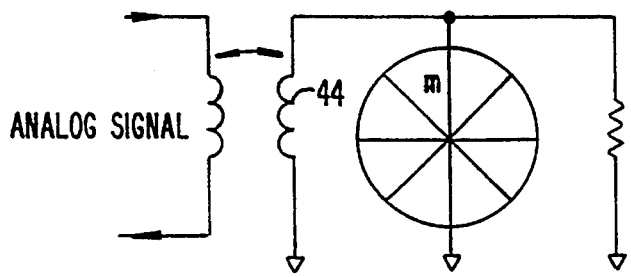
FIG. 3.
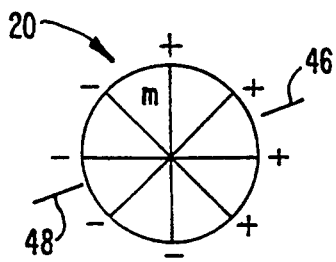 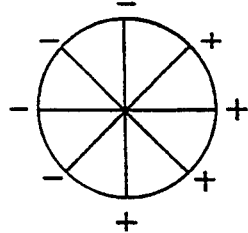
FIG. 4A.    FIG. 4B.

SUPERCONDUCTING QUANTIZER AND A/D CONVERTER SYSTEM

BACKGROUND OF THE INVENTION

The present invention relates to a signal quantizer employing Josephson junctions and to a high resolution A/D converter, using the signal quantizer.

There are two major ways to build a high resolution N-bit A/D converter using Josephson junction circuits. The first way is to use a superfast binary counter to serially count the number of flux quantum transitions of a single Josephson junction in response to an input analog signal. The second way is to resolve all bits of the analog signal in parallel using a set of $\Phi_0$-periodic comparators based on two-junction superconductive quantum interferometer devices (SQUID), $\Phi_0 = 2.07*10^{-15}$ Wb being the magnetic flux quantum.

The A/D converter of the first type has very high precision but it can convert only very low-frequency signals. The converter of the second type is operable at sampling rates exceeding 1 GHz, but it has a low resolution, because to get N correct bits it requires the parameter margins of the divider and comparator to be as small as $2^{-N}$.

Rylov et al.'s paper entitled "Josephson Junction A/D Converters using Differential Coding," *IEEE Transactions on Magnetics*, Vol. MAG-23, No. 2, pp. 735–738, March 1987, describes a high speed high resolution A/D converter based on a signal quantizer called "SQUID wheel." Rylov's SQUID wheel has $2^p$ "spokes" consisting of identical Josephson junctions and small inductances, connected between a wheel rim and center node of the wheel, p being a positive integer, such that successive junctions are phased $2\pi/2^p$ apart. The entire wheel is shunted by another inductor (not shown by Rylov) so that all of the junctions respond periodically to the inductor's external magnetic flux created by the analog input signal with the same built-in period $\Phi_0$. The very high accuracy of the $\Phi_0$-periodicity of the SQUID wheel is determined by the existence of flux-quantization in the superconductors, one of the fundamental preservation laws of nature. This extremely high accuracy of the $\Phi_0$ periodicity allows the automatic matching of the elements in the p-bit interpolator over a very large dynamic range and therefore can be used to achieve very high resolution of the A/D converter without sacrificing the speed of the A/D conversion.

In the Rylov's embodiment the center of the wheel is grounded and the analog signal is injected into the rim. However, a potentially large analog signal in Rylov's embodiment can create crosstalk in the presence of a finite inductance rim, which would disrupt the relative junction phases.

In FIG. 3, Rylov illustrates how to read the SQUID wheel with r ($=2^{p-1}$) comparators. In an example given by Rylov, p=3, and r=4. However, the number of superconducting wiring crossovers in such a scheme is also r=4, which creates a severe problem, because in the most complicated superconductor IC processes, the number of superconducting wiring crossovers is 1-2. Furthermore, Rylov proposed read-out geometry is plugged with crosstalk and imbalance problems.

Thus, while the Rylov SQUID wheel is a step in the right direction for achieving a high resolution high speed A/D converter, it is nonetheless impractical.

Therefore, it is desirable to provide a practical and improved high resolution high speed A/D converter.

SUMMARY OF THE INVENTION

The present invention is unique because it enables the practical realization of 8-11 bit A/D converter with gigahertz or multi-gigahertz bandwidth. Such a combination of high resolution A/D conversion with a high speed of conversion was impossible or impractical in any of the prior A/D superconducting or conventional A/D converters.

One aspect of the present invention is directed to a quantizer circuit using a phase wheel for transforming an input analog signal into a $\Phi_0$-periodic function of the input signal. The phase wheel comprises a rim, usually grounded, and a plurality of spokes connected to the rim and a center node. Each spoke includes a Josephson junction and an inductor, connected to the superconducting ground. The input signal is being injected at the center node.

Another aspect of the present invention is directed to a quantizer circuit using a phase tree for transforming an analog input signal into a $\Phi_0$-periodic function of the input signal. The phase tree includes p levels of branch conductors, p being a positive integer. The lowest level comprises $2^p$ circuits, wherein each circuit includes a Josephson junction.

An additional aspect of the present invention is directed to a high resolution A/D converter comprising a resistive ladder circuit and n (a positive integer) above-described inductively shunted phase wheel quantizers, each connected to one of the n outputs of the resistive ladder. Each wheel includes a number of spokes. In addition, each spoke also includes a Josephson junction, an inductor and a clocked current comparator connected in series with the junction and inductor.

One more aspect of the present invention is directed to a high resolution A/D converter using the phase tree. The phase tree has p (positive integer) levels, the lowest level having $2^p$ circuits, each circuit including a Josephson junction and a superconducting comparator connected in series.

In the preferred embodiment, the phase tree has the flux $\Phi_0/2$ highest at the lowest "leaf" level and each pair of the two Josephson junctions at the lowest level having opposite phases.

Yet another aspect of the present invention is directed to an A/D converter comprising a phase wheel quantizer described above. Each of the spokes of the phase wheel includes a Josephson junction and a superconducting current comparator.

One more aspect of this invention is directed to a high resolution A/D converter comprising a phase tree or a phase wheel converter for the conversion of the least significant bits (LSB) of the input analog signal and a superconducting bidirectional flux quantum counter for conversion of the most significant bits (MSB) of the analog signal.

One more aspect of the present invention is directed to a high resolution A/D converter comprising a quantizer-converter based on the above described phase wheel quantizer or phase tree quantizer for the LSB conversion of the input signal connected serially or in parallel with a flash converter for the conversion of the MSB of the input signal.

Another aspect of the present invention is directed to a clocked current comparator comprising a quantum flux parametron and an inductive load-latch circuit providing the latching readout of the comparator.

In the preferred embodiment the clocked current comparator is a quantum flux parametron, comprising two Josephson junctions, two inductors and a load inductor.

BRIEF DESCRIPTION OF THE DRAWINGS

FIG. 1A is a schematic circuit diagram of a M-spoke phase wheel, with M=8, to illustrate a wheel embodiment of this invention.

FIG. 1B is a short hand symbol of the circuit of FIG. 1A.

FIG. 2 denotes an equivalent circuit of the k-th spoke of the phase wheel in FIG. 1, where k is a positive integer ranging from 1 to 8.

FIG. 3 illustrates the magnetic coupling input of the analog signal to the phase wheel in FIG. 1.

FIGS. 4A and 4B show two different sets of the midnight and noon locations of the flux phase and the flux phase rotation around the phase wheel in FIG. 1.

Identical components in the figures are labeled by the same numerals.

DETAILED DESCRIPTION OF THE PREFERRED EMBODIMENT

Figure 5:
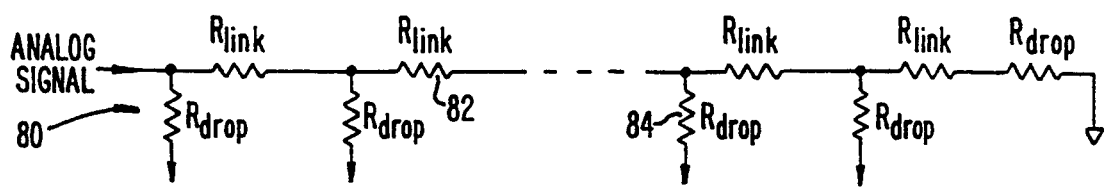
FIG. 5 is a schematic circuit diagram of a resistive ladder network for a n(p+1)-bit A/D converter using n phase wheels and resolving (p+1) bits per wheel to illustrate the invention.

A broad area of applications has developed around the peculiar properties of tunneling between superconductors. In 1962 B. D. Josephson pointed out that it should be possible for electron Cooper pairs to tunnel between closely spaced superconductors. The pair-tunneling current depends on the difference of phases of the effective wave functions on the two sides of the junction. Thus, the Josephson junction reveals quantum mechanics operating at a macroscopic level. For instance, we have the quantization of flux $\Phi$ in units of flux quantum $\Phi_0=h/2e$, where e is the charge of an electron, h is Planck's constant, and the periodic field dependence of quantum interference around circuits containing Josephson junctions. The macroscopic quantum phenomena like the flux quantization in the circuits with the Josephson junctions became the starting point for the development of different devices including A/D converters.

The current through a Josephson junction is often well described by the Josephson current-phase relationship, $I=I_c^*\sin\phi$, where $I_c$ is the maximum supercurrent that the Josephson junction can support and $\phi$ is the phase difference of the superconducting wave function across the junction. Consider a circuit including a Josephson junction connected in a loop with a superconductor inductor. If a current is taken well inside the bulk of the superconductor on either side of the junction, continuity of the phase of the superconducting wave function requires that $2n\pi=-\phi+2\pi\Phi/\Phi_0$, where $\Phi$ is the magnetic flux in the inductor. The circulating supercurrent can therefore be expressed as $I=I_c\sin(2\pi\Phi/\Phi_0)$. In the absence of an applied field, the flux within the circuit with the Josephson junction and the inductor is determined by the circulating current, $\Phi=LI$, (where L is the circuit inductance) so that $\Phi=LI_c^*\sin(2\pi\Phi/\Phi_0)$. The magnetic behavior of such a circuit is determined by the parameter $\beta=2\pi LI_c/\Phi_0$. If $\beta<1$ there is only one solution, $\Phi=0$, and the circuit is unable to trap flux. If $\beta>1$, more than one solution is possible corresponding to the trapping of flux. For $\beta>>1$, a large number of flux trapping states exist, in which the flux enclosed is a near multiple of h/2e. So, we have a flux quantization phenomenon in a circuit with the Josephson junction even in the absence of the external input signal.

The circuit with the Josephson junction can also be biased by an externally applied input signal, which causes the external flux $\Phi_{ext}$, produced by the current carrying coil within the circuit. The diamagnetic induced shielding current is then given by $(\Phi-\Phi_{ext})/L$.

The flux within the circuit with the Josephson junction is then given by $\Phi_{ext}=\Phi-LI_c^*\sin(2\pi\Phi/\Phi_0)$. The magnetic behavior of such a circuit depends critically on $\beta=2\pi LI_c/\Phi_0$.

For $\beta<1$, the magnetic behavior is reversible, whereas for $\beta>1$ the magnetic behavior is hysteretic. However, in both cases, whether reversible or hysteretic, the magnetic properties are periodic in the externally applied flux with periodicity $\Phi_0$. Therefore, we have the opportunity to use the flux-quantization and the flux-periodicity of the circuit with the Josephson junction for the superconducting A/D conversion of the analog input signal into a digital signal.

The present invention goes beyond this regular superconducting A/D conversion by introducing the phase wheel quantizer and the phase tree quantizer. Indeed, the regular superconductor A/D converter resolves the analog signal up to the single flux quantum $\Phi_0$. Both the phase tree and the phase wheel quantizers in combination with the superconducting comparator are able to resolve $\frac{1}{2}^{p+1}$ of the magnetic flux quantum $\Phi_0$, where p is the number of branch conductor levels for the phase tree and $M=2^p$ is the number of spokes for the phase wheel.

The invention of the phase wheel is first described. The phase wheel generalizes the notion of a Josephson junction. In FIG. 1B, we show the symbol for an M-spoke phase wheel 20, where M=8. In FIG. 1A the phase wheel 20 is shown with the different spokes 22, with the center node 24 of the wheel 20, and with the rim 26. The rim is grounded to the superconducting ground 30, and the input signal is injected at the center through the connection 28.

For binary A/D conversion, it is most efficient to choose M to be a power of 2. The equivalent circuit for the $k^{th}$ spoke is shown in FIG. 2. Each spoke 22 includes an inductance $L_{spoke}$ 32, in series with a Josephson junction 34 with critical current $I_c$, in series with a clocked current comparator (CCC) 40. Successive spokes are preferably linked by damping resistors 42. The only difference between the spokes is the value of the flux bias. The $k^{th}$ spoke (k ranging from 1 to M) receives a flux bias of $(k-1)\Phi_0/M$ (corresponding to a control current of $(k-1)\Phi_0/ML_{spoke}$), In this way, the initial phases of the M junctions are set approximately at $2(k-1)\pi/M$, (k=1, ... M).

Since the Josephson current through junction k is $I_c\sin\Phi_k$, where $\phi_k$ is its phase, and the M junctions are nearly uniformly spread out in phase over $2\pi$ radians, the Josephson currents through half (or about half if M is odd) of the M junctions will be positive and the Josephson currents through the other half (or about half) of the M junctions will be negative for any current injected into the wheel. One can think of the positive spokes as representing "daytime" and the negative spokes as representing "nighttime." The "noon" position is taken where the Josephson currents are maximum (as at 46 in FIG. 4) and the "midnight" position is taken where the Josephson currents are minimum (as at 48 in FIG. 4). Mathematically, noon is where $\phi_k$ is nearest $\pi/2$ mod $2\pi$ and midnight is where $\phi_k$ is nearest $-\pi/2$ mod $2\pi$.

When the wheel is connected in a loop with an inductor 44, as shown in FIG. 3, we have a generalization of an rf SQUID with the wheel replacing the single Josephson junction. The rf SQUID is one Josephson junction connected in a loop with an inductor. As the applied flux to the SQUID loop increases (decreases) all of the M Josephson junction phases increase (decrease). Due to the alternating nature of $I_c\sin\phi_k$, the sets of positive and negative Josephson currents will change and the "noon" position will rotate. This behavior is illustrated in FIG. 4. The action is periodic so that every time the applied flux changes by $\Phi_0$, one complete "day" will pass, i.e., noon will have rotated all the way around the wheel. If $L_{spoke}$ is kept small enough, the incremental action is also linear, i.e., a flux change of $\Phi_0/M$ will move the noon position by one spoke. By clocking all of the current comparators at once, we determine which spokes are positive and which are negative and therefore the position of noon. Noon can fall into any of M spokes or any of M positions midway between spokes. Each of the 2 different noon positions can be distinguished from any other by the set of comparators for a total of 2M separate states. This device therefore resolves the analog flux to $\Phi_0/M$ periodically in $\Phi_0$.

Figure 14:
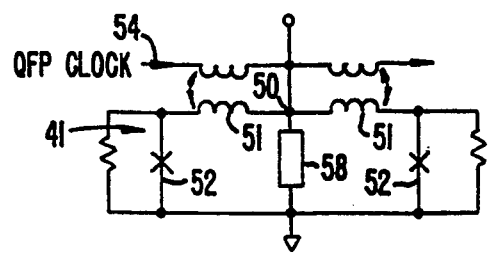
FIG. 14 is a schematic circuit diagram of a Quantum Flux Parametron (QFP) realization of a clocked current comparator to illustrate the present invention.

There are many different realizations of the CCC. The preferred embodiment of CCC is the quantum flux parametron (QFP) 41, shown in FIG. 14. The QFP is almost an ideal current comparator, receiving input current in the gate node 50 of a 2-junction SQUID 52 and clocking from the magnetic control line 54. The output load inductance 58 of the QFP should look like a small inductance so that the positive or negative response current exceeds the initial input current and is transferred mostly to the load and away from the wheel. This insures that the CCC's from the different spokes do not influence each other and that they all reset properly when the clock goes away.

Figure 15:
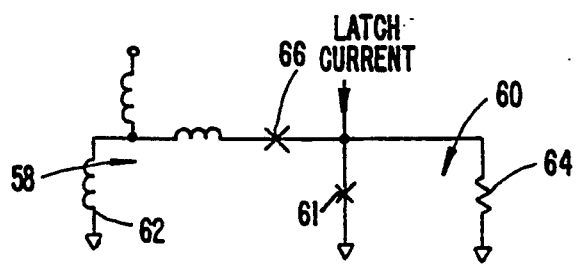
FIG. 15 is a schematic circuit diagram of an inductive load and latch circuit employed in the circuit of FIG. 14 to illustrate the present invention.
Figure 16:
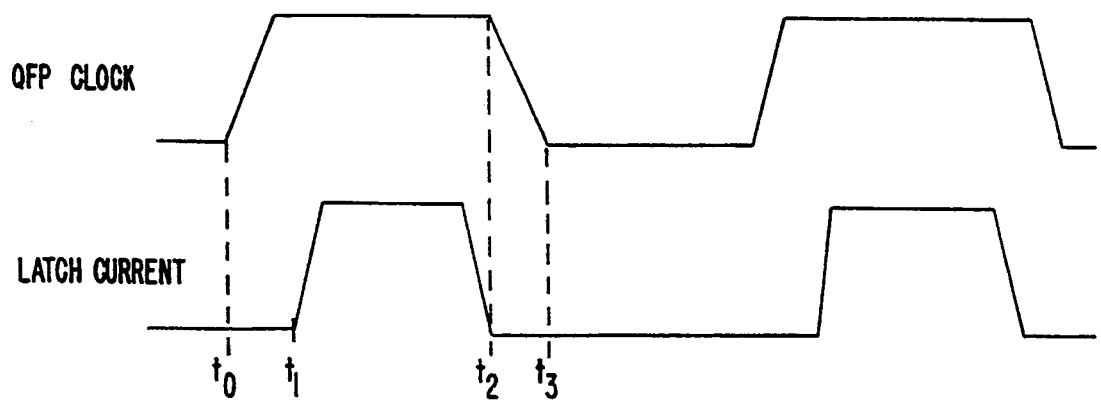
FIG. 16 is a timing diagram of the digital circuitry to illustrate the QFP clock and the latch current of the present invention.

There are several choices of load-and-latch configuration 58. The preferred configuration is shown in FIG. 15. The current delivered from the QFP is partly delivered to the latch 60 and partly to the grounded inductor $L_{dump}$ 62. The latch current is raised at time $t_1$ after the QFP's are clocked at time $t_0$, and, to insure greatest margins, is shut off at time $t_2$ before the QFP clock turns off at time $t_3$, as shown in the timing diagram of FIG. 16. When latching occurs, the combination of load resistor 64 ($R_{load}$), the isolation junction 66 ($J_{iso}$), and inductor $L_{dump}$ protects against cross-talk through the adjacent spokes of the wheel to the other latches.

Figure 6:
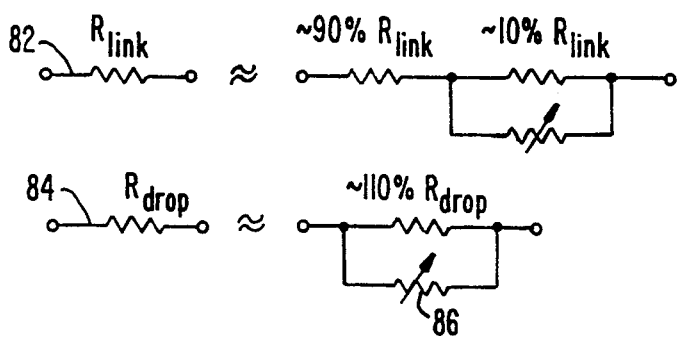
FIG. 6 is a schematic diagram of the elements of the resistive ladder in FIG. 10 to illustrate finely adjusted ladder resistors free from nonlinearity.

Using multiple phase wheels we can build a high resolution A/D converter. If each wheel has $M=2^p$ spokes and there are n wheels, then an N-bit converter with $N=n(p+1)$ results. The analog signal is divided among the n wheels using a resistive ladder 80, as shown in FIG. 5. The ratio of the ladder resistors 82 ($R_{link}$) and 84 ($R_{drop}$) is chosen to be $R_{link}/R_{drop}=(2^{p+1}-1)^2/2^{p+1}$. The resulting analog input resistance is $((2^{p+1}-1)/2^{p+1})R_{drop}$. Only the wheel resolving the least significant bits requires compensation, since the slew rate is attenuated for the wheels resolving the most significant bits. It is very attractive to use an active resistor trimming (i.e., using transistors as controllable resistors 86 in FIG. 6) to guarantee high accuracy because $R_{link}>>R_{drop}$ for large M. This is accomplished by inserting the controlled resistors, so that none of them sees more than a small fraction of the full analog voltage, which is important to guarantee linearity.

Another realization of the signal quantizer will be described which allows the user to resolve fractions of the flux quantum. This is the phase tree.

The phase tree responds periodically to flux penetrating the loop with a period $\Phi_0$. Like the phase wheel or SQUID wheel, the phase tree has internal flux (phase) biasing which distinguishes the Josephson junctions and provides much more additional information than a single-junction SQUID.

Figure 7:
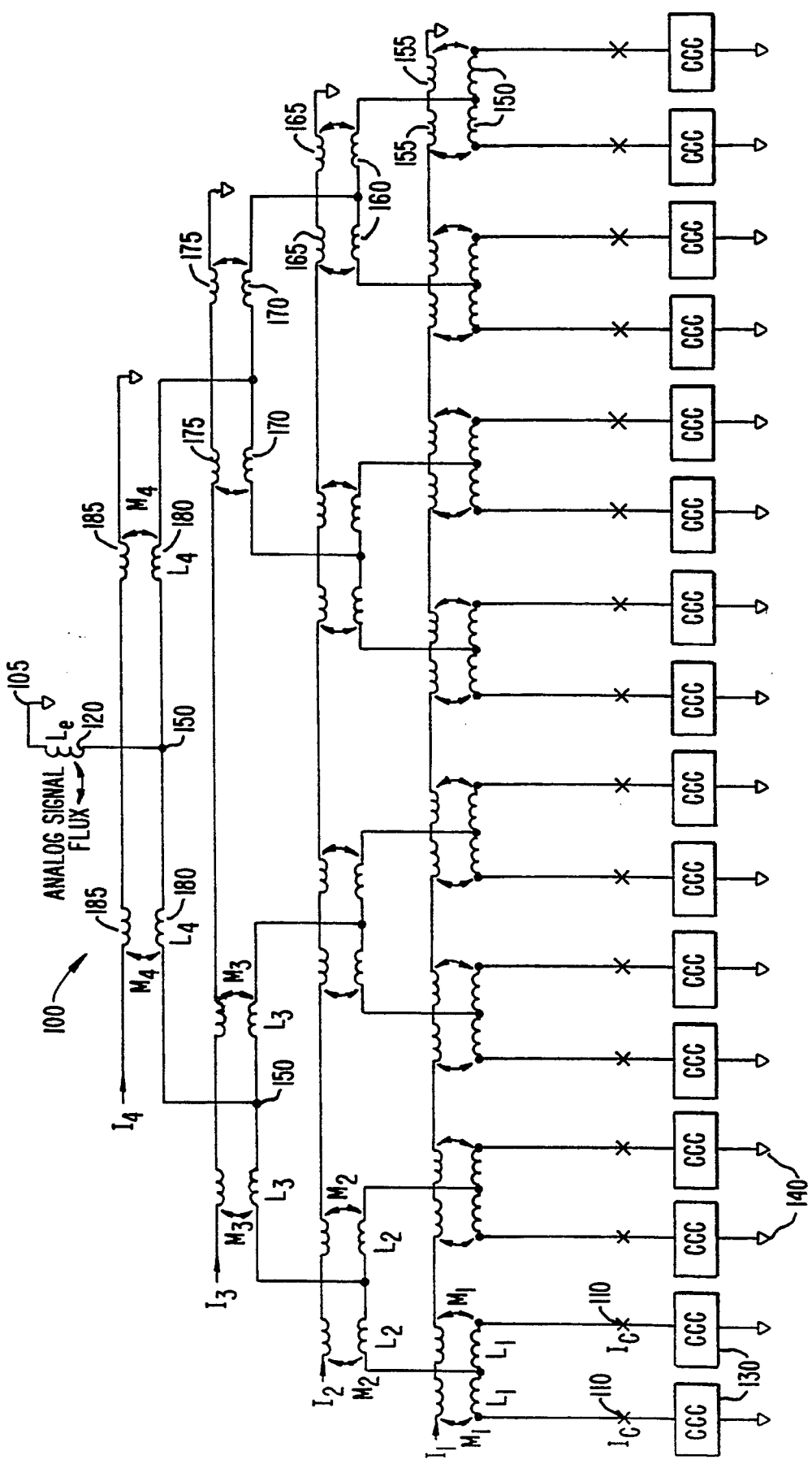
FIG. 7 is a schematic circuit diagram of a phase tree with four (p=4) levels of branch conductors to illustrate one embodiment. The lowest level branch conductor each includes a Josephson junction and a superconducting current comparator.

A binary phase tree 100 has $2^p$ Josephson junctions 110, p being a positive integer, with p=4 as an example in FIG. 7. The junctions form the "leaves" of the tree. The shunt inductance 120 is connected to the "trunk" 105 of the tree, which is where the signal enters. The junctions are connected in series with clock current comparators (CCC's) 130 to the superconducting ground 140. Beginning at the trunk, at each branching point 150, the circuit splits into two identical superconducting branches. Connection inductances 150 at the leaf level are denoted $L_1$; connection inductances 160 at the next lowest level are denoted $L_2$, and so on (170 is $L_3$ and 180 is $L_4$). There are p flux bias lines, one for each level in the tree. Their mutual inductances to $L_1$, $L_2$, $L_3$ and $L_4$ are 155 (denoted $M_1$), 165 (denoted $M_2$), 175 (denoted $M_3$), and 185 (denoted $M_4$).

Figure 8:
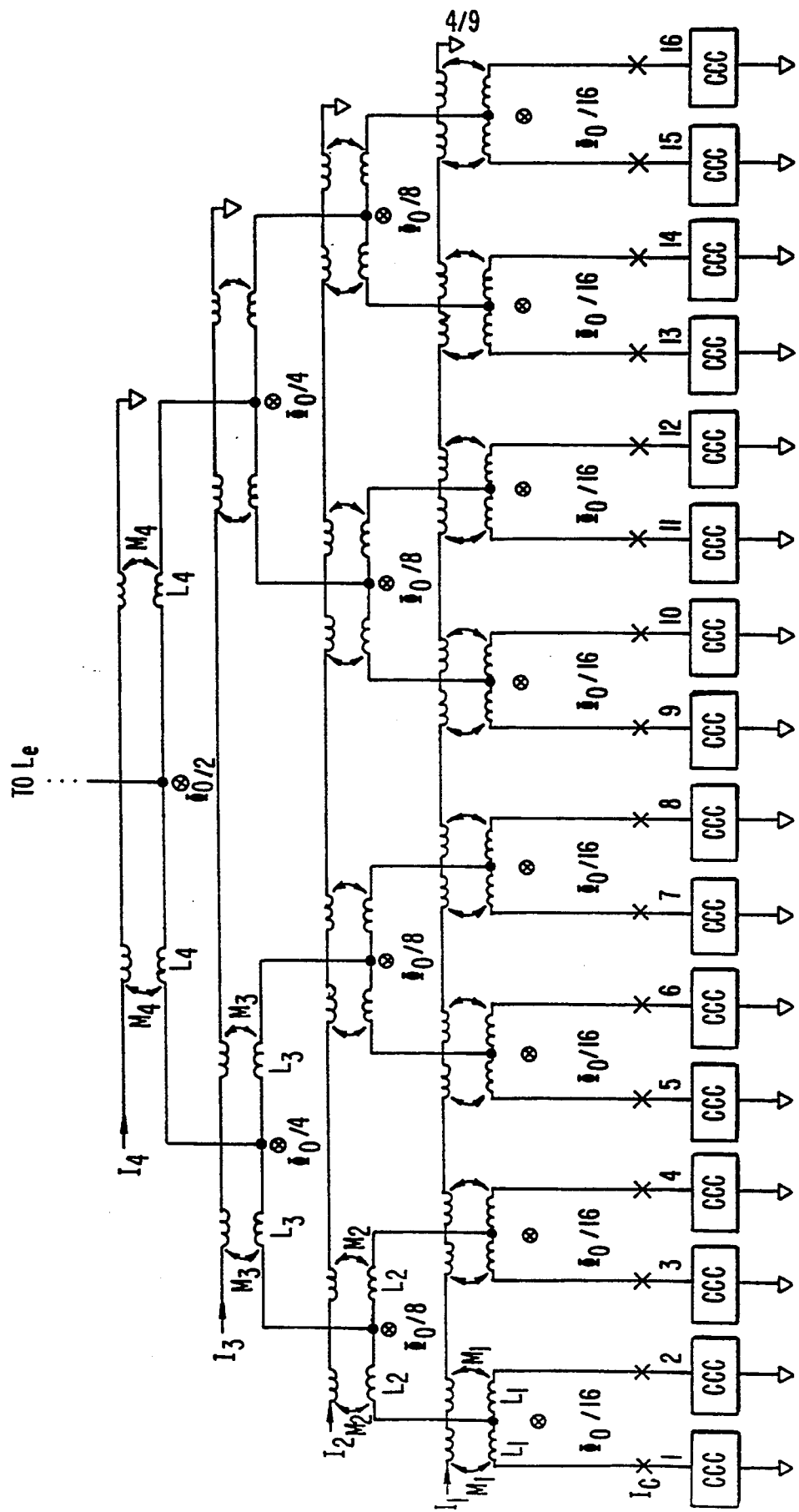
FIG. 8 is a schematic circuit diagram of a phase tree in a top-down flux biasing configuration to illustrate another embodiment of the invention.

There are actually two opposite methods of flux biasing the phase tree, top-down and bottom-up. In the top-down scheme, shown in FIG. 8, the biasing fluxes are $\Phi_0/2$ in the highest level loop, $\Phi_0/4$ in both of the next highest level loops, $\Phi_0/8$ in the next level loops, and so on. The leaf level loops have $\Phi_0/2^p$. All this is accomplished by injecting the appropriate currents in the p flux bias lines. For example, at the leaf level the current is $\Phi_0/(2^{p+1}M_1)$, where for p=4 the currents are given by:

$$I_1 = \Phi_0/32M_1, I_2 = \Phi_0/16M_2, I_3 = \Phi_0/8M_3,$$
$$I_4 = \Phi_0/4M_4.$$

(The extra factor of 2 in the denominator is due to the fact that there are two $M_1$ couplings per loop.) The top-down flux biasing scheme distributes the junctions evenly in phase in increments of $2\pi/2^p$ in a phase sequence that exactly corresponds to their spatial sequence, so the phase difference between any two adjacent junctions is $\Phi_0/2^p$. This is much like the case of the phase wheel or SQUID wheel. The monotonically increasing phase sequence 1 through $2^p$ is explicitly shown in FIG. 8, by labeling each of the junctions.

Figure 9:
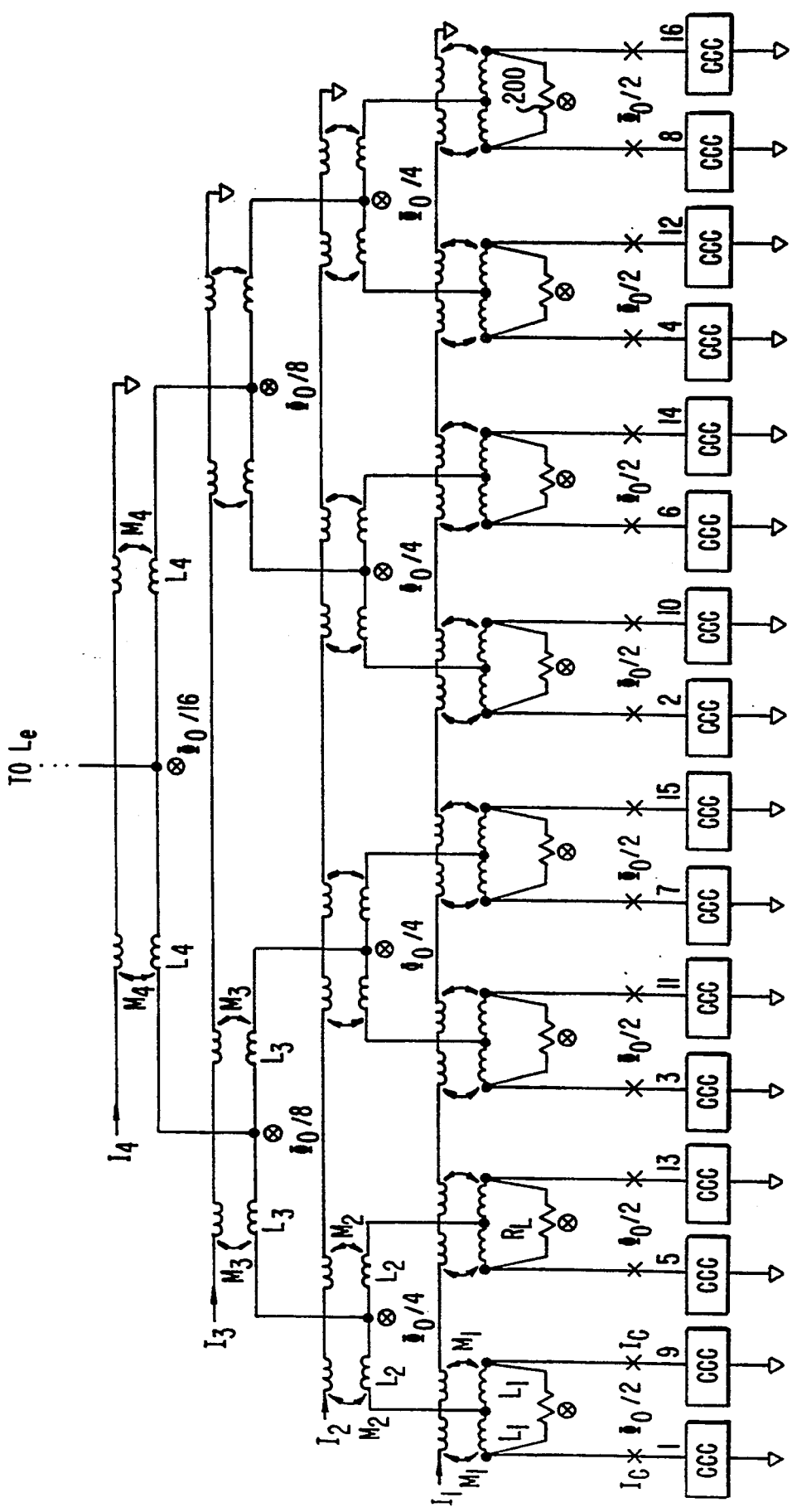
FIG. 9 is a schematic circuit diagram of a bottom-up flux biasing configuration of a phase tree to illustrate the preferred embodiment of the invention.

A preferred embodiment for a phase biasing technique is the bottom-up scheme, shown in FIG. 9. Now the fluxes are $\Phi_0/2$ in the lowest level loops, $\Phi_0/4$ in the next lowest level, and so on, ending in $\Phi_0/2^p$ in the highest level loop. Again the appropriate currents are injected in the p flux bias lines. For example, at the leaf level the current $I_1$ is $\Phi_0/4M_1$. The other currents are given by:

$$I_2 = \Phi_0/8M_2, I_3 = \Phi_0/16M_3, I_4 = \Phi_0/32M_4$$

The bottom-up scheme also distributes the junctions evenly in phase in increments of $2\pi/2^p$. The phase sequence for p=4 is shown in FIG. 9. The phase sequence is permutated (1, 9, 5, 13, 3, 11, 7, 15, 2, 10, 6, 14, 4, 12, 8, 16) with respect to the actual spatial sequence (1, 2, 3, ...). The permutation of the original phase sequence achieved in the bottom-up embodiment is the well known decimation permutation, which is its own inverse, therefore the same decimation permutation restores the original sequence.

The bottom-up phase scheme is superior to the top-down method for both static and dynamic reasons. Statically, one desires minimum hysteresis in the A/D converter. This is achieved by minimizing the parameter $\beta = 2\pi L_e I_e/\Phi_0$, where $L_e$ is the shunt inductance 120 of the phase tree and $I_e$ is the effective critical current of the phase tree. As $L_e$ is fixed by signal coupling considerations, one must minimize $I_e$. The bottom-up phase biasing scheme achieves the global minimum in $I_e$, especially if the leaf inductances $L_1$ are kept small. The top-down phase biasing scheme achieves only a local minimum in $I_e$, and this local minimum is rather large unless the trunk inductance ($L_4$ in the case p=4) is kept very small. In practice, it is much easier to lay out small leaf connections than small trunk connections. That is why the bottom-up scheme is a superior scheme than the top-down.

Dynamically, the bottom-up scheme has another advantage. Since Josephson tunnel junctions inevitably possess capacitance, it is necessary to insert damping resistors to quench L-C oscillations. Preferably, these damping resistors should not slow down the tracking rate of the phase tree. Such damping that satisfies these requirements is easily obtained in the bottom-up scheme, as shown by the placement of the resistors 200 in FIG. 9. The reason why this damping is so effective is that each junction is damped across to its partner junction that is $\pi$ out of phase. When one junction is "switching" (leaving a normally stable phase region and entering a normally unstable region its partner is "anti-switching" (leaving a normally unstable phase region and entering a normally stable region). Provided that $\beta = 2\pi L_e I_e/\Phi_0$ is sufficiently small and the flux at the leaf loop level is $\Phi_0/2$, there is little ac Josephson current left to excite any of the other modes. The top-down phase biasing scheme is much more difficult to damp properly.

Figure 10:
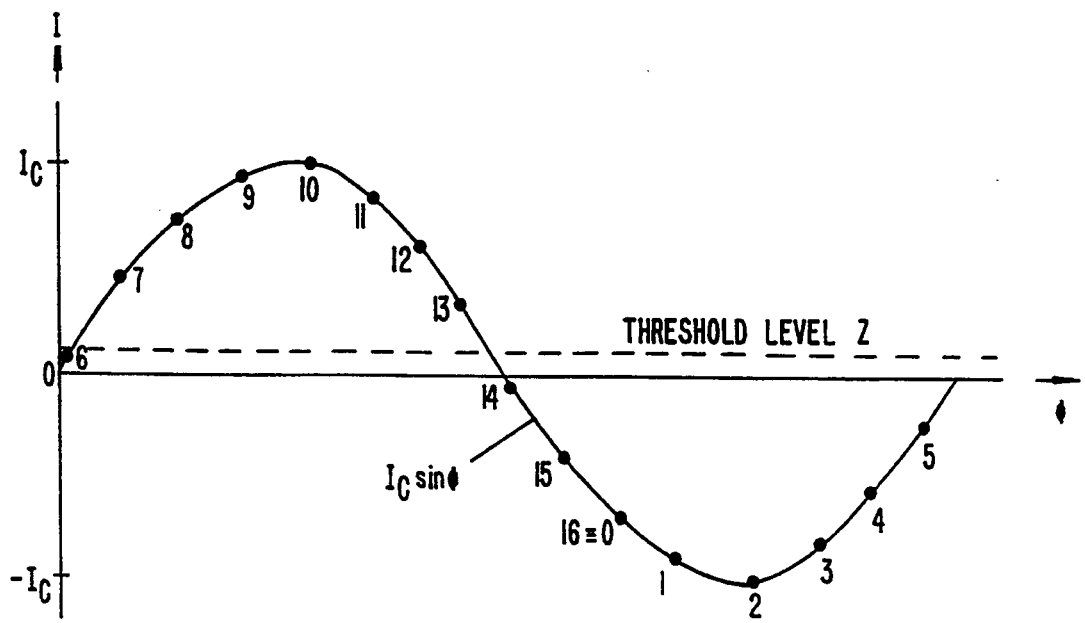
FIGS. 10A and 10B are phase diagrams to illustrate the setting of the threshold of the comparators to achieve the extra (p+1) bit resolution of the analog signal.
Figure 10:
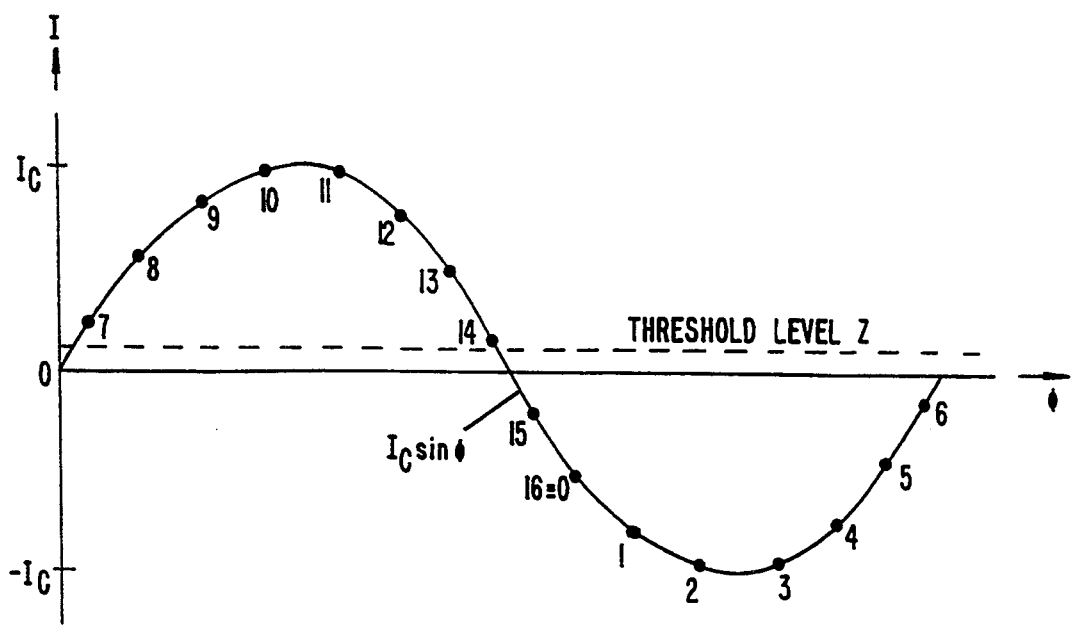

FIGS. 10A and 10B show some examples of the thresholding situation sufficient to get an extra bit resolution in A/D conversion using the phase tree or the phase wheel. One period of a sine function is illustrated, representing $I_c\sin\phi$. Due to the phase biasing in the phase tree or wheel, any given sample discretely maps out this sine function in $2^p$ points, as illustrated (p=4 here). The labels in FIG. 10 correspond to the unscrambled phase sequence and not necessarily the physical, spatial sequence of the junctions. (These will be different but related by the decimation permutation in the case of the bottom-up phase biasing.) In example 10(A), exactly one less than half (7) of the junctions are above threshold and exactly one more than half (9) are below. To the best resolution that can be inferred by thresholding, the peak of the sine function occurs at position 10. In example 10(B), exactly half (8) of the junctions are above threshold and the other half are below. The peak of the sine function is now inferred to occur at position 10½. Since position 10 corresponds to a signal flux of $10\Phi_0/16$ and position 10½ corresponds to $10½\Phi_0/16$, we can successfully resolve $\Phi_0/32$ or 5 (=p+1) bits.

Obtaining this extra bit depends on the placement of the threshold level. If the threshold is exactly zero, the extra bit is lost. The preferred threshold levels Z are given by:

$$Z = \pm I_c \sin\{((2l+1)\pi)/(2^{p+1})\}; l=0, 1, 2, \ldots,$$
$$2^{p-1}-2$$

It is necessary that $p \geq 2$ for the extra bit to be available.

Figure 11:
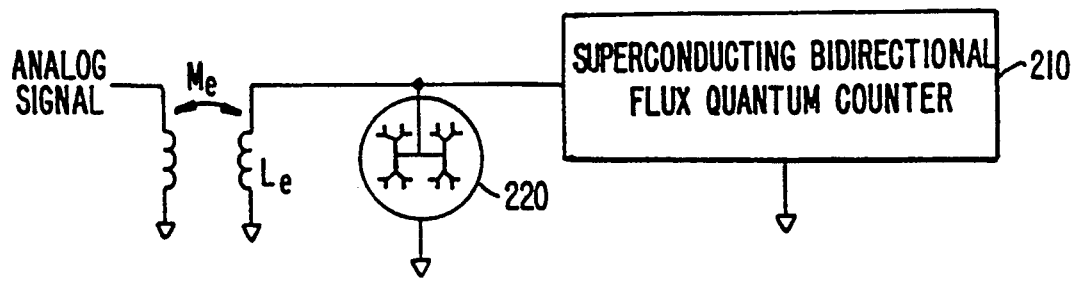
FIG. 11 is a schematic circuit diagram to illustrate the preferred embodiment of a N-bit A/D converter using a phase tree for resolving the (p+1) least significant bits (LSB's) of the input signal and using a superconducting bidirectional flux quantum counter for resolving the (N-p-1) most significant bits (MSB's).

One can use the periodic interpolating capability of the phase tree or phase wheel in a number of different high resolution A/D schemes. We can resolve the p+1 LSB's using the phase tree or the phase wheel after the N-p-1 MSB's are resolved by a conventional A/D converter. One can use a superconducting flux quantum counter 210 to resolve the N-p-1 MSB's with the combination of the phase tree 220 to resolve additional p+1 LSB's, as shown in FIG. 11.

Figure 12:
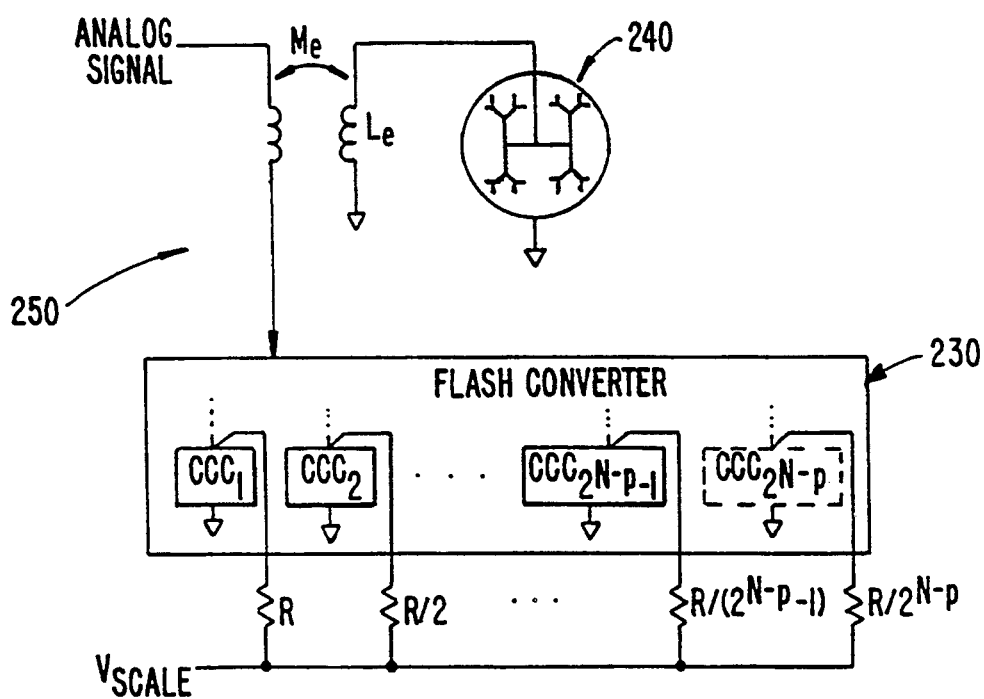
FIG. 12 is a schematic circuit diagram of a N-bit A/D converter using a phase tree for resolving the (p+1) LSB connected in parallel or in series with a flash converter for resolving the (N-p) MSB's.
Figure 13:
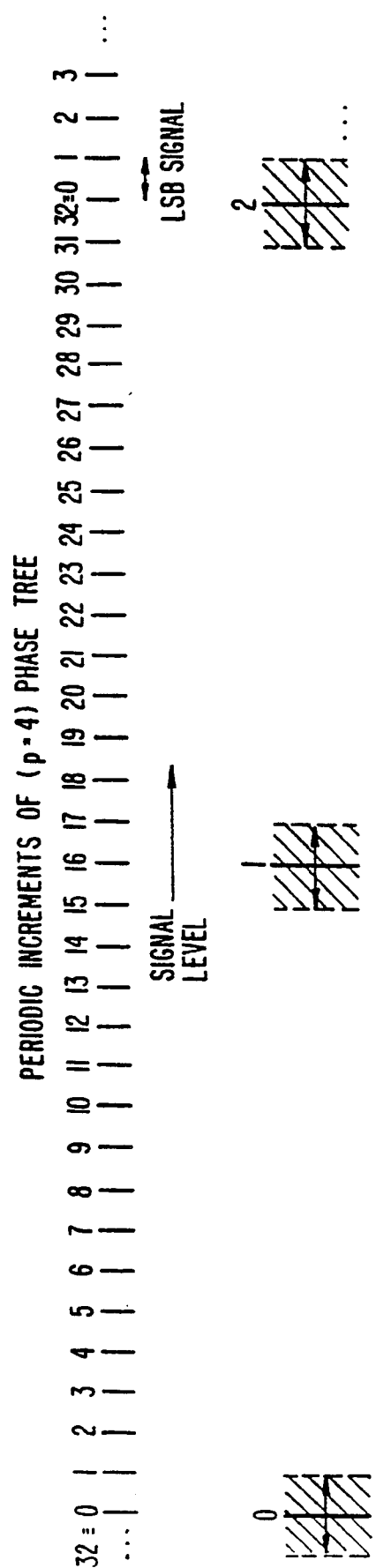
FIG. 13 is an illustration of the 1-bit overlap scheme for achieving tolerance in the sector of the most significant bits (MSB's).

A very simple and reliable way of incorporating a (p+1)-bit phase tree 240, where p is 3 or 4, in an N (8 to 11) bit A/D converter 250 is shown in FIG. 12. An (N−p)-bit flash converter 230 provides N-p-1 most significant bits (MSB's). The scale of the flash converter can be simply adjusted by changing the voltage $V_{scale}$, which proportionally changes all of the flash comparator thresholds. The scale is adjusted so that one full period of the phase tree or wheel corresponds to two increments in the MSB flash sector. That is, there is an overlap of one bit between the non-periodic MSB sector and the periodic LSB sector. The total number of bits is given by $(p+1)+(N-p-1)=N$, where the last subtraction of 1 is due to the overlap. The reason for the overlap is shown in FIG. 13. The thresholds of the (N−p)-bit flash converter should not have to be precise to N-bit accuracy or else the converter is impractical. 1-bit overlap allows the accuracy of the MSB sector to be only (N-p) bits. The algorithm is as follows. One reads the phase tree interpolator LSB code. If the code is within $2^{p-1}$ of 0 or $2^{-1}$, one reads the MSB code only up to the nearest odd increment. If the code is more than $2^{p-1}$ away from 0 or $2^{p+1}$, one reads the MSB code only up to the nearest even increment. Then one adds the codes to get an N-bit code that is accurate, in spite of the inaccuracy in the MSB threshold points. All that is required is that the interpolating LSB sector be N-bit accurate, and this is guaranteed by the periodicity of the phase tree or phase wheel and the fact that only one analog component is used to determine this periodicity.

The phase tree and the phase wheel achieve a higher resolution-bandwidth performance than any existing device. They achieve 3-5 bits more flux resolution than any previous superconducting A/D scheme. 8-11 bit (and possibly even 12-bit) converters with gigahertz bandwidth are made possible with this invention.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A quantizer circuit for transforming an analog input signal into a periodic function of the analog input signal, said circuit including a superconducting ground, said circuit comprises:
   a phase wheel comprising a rim and a plurality of spokes connected to the rim and a center node, each spoke including a Josephson junction and inductor, connected to the superconducting ground;
   means for applying the analog signal to the center node and a reference phase to the rim, said analog signal causing Josephson currents in the spokes, said Josephson junction in each said spoke having a flux bias that is different from the flux biases in the remaining spokes, said Josephson currents in half of the spokes being positive and the Josephson currents in the remaining spokes being negative, wherein an indicator position is defined in reference to the maximum positive Josephson current, said indicator position rotating at a rate proportional to the slew rate of said analog signal.

2. A high resolution A/D converter comprising:
   a resistive ladder circuit and n inductively shunted phase wheels, said resistive ladder circuit comprising a resistance circuit having at least one input and n outputs, each phase wheel comprising a rim, a plurality of M spokes connected between the rim and a center node, said rim being shunted to a reference phase, each of said wheels having M spokes, each wheel being connected to one output of said ladder, each spoke of said wheel including a Josephson junction, an inductor and a clocked current comparator connected in series, said comparator comparing the currents in said Josephson junctions to a threshold level to provide an output signal;
   wherein when an analog input signal is injected through the input of the ladder, said signal is divided among the n wheels through the n outputs of said resistive ladder, said analog signal causing Josephson currents in said spokes, said Josephson junction in each said spoke having a flux bias that is different from the flux biases in the remainder spokes, said Josephson currents in half of the spokes being positive and the Josephson currents in the remaining spokes being negative, wherein an indicator position is defined so that 2M different indicator positions define 2M different states, and so that the converter has a resolution of $n(p+1)$ bits.

3. The phase wheel converter of claim 2, wherein the clocked current comparator is a quantum flux parametron, said quantum flux parametron comprising a superconducting loop, said loop having two Josephson junctions, two loop inductors and a load inductor, said loop inductors being coupled magnetically with an excitation line.

4. A quantizer circuit for transforming an analog input signal into a periodic function of the analog input signal, wherein said circuit comprises:
   a phase tree comprising p levels of branch conductors, said p levels including a highest level having two branch conductors, p being an integer greater than or equal to 2, each branch conductor at a higher level being connected to two branch conductors at the level immediately below, the lowest level branch conductors defining a leaf level which comprises $2^p$ circuits, each circuit including a Josephson junction;
   a flux biasing means setting each of the Josephson junctions to a different predetermined phase of flux.

5. A high resolution A/D converter comprising:
   a phase tree comprising p levels of branch conductors, said p levels including a highest level having two branch conductors, p being an integer greater than or equal to 2, each branch conductor at a higher level being connected to two branch conductors at the level immediately below, the lowest level branch conductors defining a leaf level which comprises $2^p$ circuits, each circuit including a Josephson junction connected in series to a clock current comparator, said comparator comparing the currents in said Josephson junctions to a threshold level to provide an output signal;
   a flux biasing means setting each of the Josephson junctions to a different predetermined phase of flux.

6. The high resolution N-bit A/D converter of claim 5, wherein the flux biasing means applies the highest flux $\Phi_0/2$ at the highest level and the least flux bias $\Phi_0/2^p$ at the leaf level, $\Phi_0$ being a flux quantum, said flux biasing means injecting currents in the p flux bias lines, at the highest level the current being $\Phi_0/4M_p$, wherein $M_p$ is the mutual inductance of the flux bias line at the highest level to connection inductance $L_p$ at the highest level.

7. The high resolution N-bit A/D converter of claim 5, wherein the flux biasing means applies the highest flux $\Phi_0/2$ at the leaf level and the least flux bias $\Phi_0/2^p$ at the highest level, $\Phi_0$ being a flux quantum, said flux biasing means injecting currents in the p flux bias lines, at the leaf level the current being $\Phi_0/4M_1$, wherein $M_1$ is the mutual inductance of the flux bias line at the leaf level to connection inductance $L_1$ at the leaf level.

8. The phase tree converter of claim 5, wherein the clock current comparator is a quantum flux parametron, said quantum flux parametron comprising a superconducting loop, said loop having two Josephson junctions, two loop inductors and a load inductor, said loop inductors being coupled magnetically with an excitation line, the threshold of said comparator is being set to achieve the extra (p+1) bit resolution of said analog input signal.

9. A high resolution N-bit A/D converter, N being a positive integer, comprising:

a (p+1) least significant bits phase tree converter and a superconducting bidirectional flux quantum counter connected to said phase tree converter for providing the (N-p-1) most significant bits;

said phase tree converter comprising p levels of branch conductors, said p levels including a highest level having two branch conductors, p being an integer greater than or equal to 2, each branch conductor at a higher level being connected to two branch conductors at the level immediately below, the lowest level branch conductors defining a leaf level which comprises $2^p$ circuits, each circuit including a Josephson junction connected in series to a clock current comparator, said comparator comparing the currents in said Josephson junctions to a threshold level to provide an output signal;

a flux biasing means setting each of the Josephson junctions to a different predetermined phase of flux.

10. A high resolution N-bit A/D converter comprising:

a least significant bit (LSB) sector and a most significant bit (MSB) sector connected serially or in parallel, the LSB sector further comprising a (p+1) bit quantizer-converter and the MSB sector further comprising a (N-p)-bit flash converter, the scale of the flash converter being adjusted so that one full period of the phase tree corresponds to two increments in the MSB flash sector resulting in overlapping of one bit between the non-periodic MSB sector and the periodic LSB sector;

said quantizer-converter being a phase tree, said phase tree comprising p levels of branch conductors, said p levels including a highest level having two branch conductors, p being an integer greater than or equal to 2, each branch conductor at a higher level being connected to two branch conductors at the level immediately below, the lowest level branch conductors defining a leaf level which comprises $2^p$ circuits, each circuit including a Josephson junction connected in series to a clock current comparator, said comparator comparing the currents in said Josephson junctions to a threshold level to provide an output signal;

a flux biasing means setting each of the Josephson junctions to a different predetermined phase of flux.

11. A high resolution N-bit A/D converter comprising:

a least significant bit (LSB) sector, a most significant bit (MSB) sector connected serially or in parallel, and a superconducting ground, the LSB sector further comprising a (p+1) bit quantizer-converter and the MSB sector further comprising a (N-p)-bit flash converter, the scale of the flash converter being adjusted so that one full period of the phase tree corresponds to two increments in the MSB flash sector resulting in overlapping of one bit between the non-periodic MSB sector and the periodic LSB sector;

said quantizer-converter comprising a phase wheel, said phase wheel comprising a rim and a plurality of spokes connected to the rim and a center node, each spoke including a Josephson junction connected in series to a clock current comparator and an inductor connected to the superconducting ground, said comparator comparing the currents in said Josephson junctions to a threshold level to provide an output signal;

means for applying the analog signal to the center node and a reference phase to the rim, said analog signal causing Josephson current in spoke, said Josephson junction in each said spoke having a flux bias that is different from the flux biases in the remainder spokes, said Josephson currents in about half of the spokes being positive and the Josephson currents in the remaining spokes being negative, wherein a noon position is defined in reference to the maximum positive Josephson current, said noon position rotating at a rate proportional to the slew rate of said analog signal.

12. A high resolution N-bit A/D converter comprising:

a phase wheel comprising a rim and a plurality of spokes connected to the rim and a center node, each spoke including a Josephson junction connected in series to a clock current comparator and inductor connected to the superconducting ground, said comparator comparing the currents in said Josephson junctions to a threshold level to provide an output signal;

means for applying the analog signal to the center node and a reference phase to the rim, said analog signal causing Josephson current in spoke, said Josephson junction in each said spoke having a flux bias that is different from the flux biases in the remainder spokes, said Josephson currents in about half of the spokes being positive and the Josephson currents in the remaining spokes being negative, wherein a noon position is defined in reference to the maximum positive Josephson current, said noon position rotating at a rate proportional to the slew rate of said analog signal.

13. The phase wheel converter of claim 12, wherein the clock current comparator is a quantum flux parametron, said quantum flux parametron comprising a superconducting loop, said loop having two Josephson junctions, two loop inductors and a load inductor, said loop inductors being coupled magnetically with an excitation line, the threshold of said comparator is being set to a non-zero value to achieve the extra (p+1) bit resolution of said analog input signal.

14. A method of achieving an extra LSB resolution of an analog signal using an analog signal quantizer-comparator, said quantizer-comparator including a signal quantizer and a signal comparator, wherein said quantizer comprises a phase tree or a phase wheel;

said method comprises the steps of:
    applying an analog input signal to said quantizer,
    setting a threshold of said comparator to a non-zero value.

15. The method of claim 14;

wherein said phase wheel comprises a rim and a plurality of spokes connected to the rim and a center node, each spoke including a Josephson junction and inductor, connected to the superconducting ground;

and wherein said step applies said analog signal to said center node.

16. The method of claim 14;

wherein said phase tree comprises:

a trunk, p levels of branch conductors, said p levels including a highest level having two branch conductors, p being an integer greater than or equal to 2, each branch conductor at a higher level being connected to two branch conductors at the level immediately below, the highest level branch conductors being connected to said trunk, the lowest level branch conductors defining a leaf level which comprises $2^p$ circuits, each circuit including a Josephson junction; wherein said applying step applies said analog signal to said trunk of said phase tree;

said method further comprising the step of flux biasing; said flux biasing step setting each of the Josephson junctions to the different predetermined phase of flux.

* * * * *